United States Patent [19]
Merrill

[11] Patent Number: 6,160,282
[45] Date of Patent: Dec. 12, 2000

[54] CMOS IMAGE SENSOR EMPLOYING SILICIDE EXCLUSION MASK TO REDUCE LEAKAGE AND IMPROVE PERFORMANCE

[75] Inventor: Richard B. Merrill, Woodside, Calif.

[73] Assignee: Foveon, Inc., Santa Clara, Calif.

[21] Appl. No.: 09/064,234

[22] Filed: Apr. 21, 1998

[51] Int. Cl.[7] .......... H01L 31/113; H01L 29/76; H01L 29/94; H01L 31/062
[52] U.S. Cl. .......... 257/292; 257/294; 257/369; 257/382; 257/435
[58] Field of Search .................. 257/291, 292, 257/294, 435, 382, 369

[56] References Cited

U.S. PATENT DOCUMENTS

| | | | |
|---|---|---|---|
| 3,934,161 | 1/1976 | Caywood | 307/311 |
| 3,988,619 | 10/1976 | Malaviya et al. | 307/311 |
| 4,363,963 | 12/1982 | Ando | 250/211 |
| 4,499,529 | 2/1985 | Figueroa | 362/283 |
| 4,573,077 | 2/1986 | Imai | 358/212 |
| 4,626,915 | 12/1986 | Takatsu | 358/213 |
| 4,654,714 | 3/1987 | Hurst, Jr. et al. | 358/213 |
| 4,742,238 | 5/1988 | Sato | 250/578 |
| 4,809,075 | 2/1989 | Akimoto et al. | 358/213.18 |
| 4,839,735 | 6/1989 | Kyomasu et al. | 358/213.31 |
| 4,843,474 | 6/1989 | Suzuki | 358/213.19 |
| 4,901,129 | 2/1990 | Hynecek | 357/30 |
| 4,942,473 | 7/1990 | Zeevi et al. | 358/213.26 |
| 5,014,107 | 5/1991 | Vora | 357/44 |
| 5,021,853 | 6/1991 | Mistry | 357/23.13 |
| 5,028,972 | 7/1991 | Watanabe et al. | |
| 5,055,418 | 10/1991 | Vora | 437/31 |
| 5,117,292 | 5/1992 | Matsunaga | 358/213.19 |
| 5,276,521 | 1/1994 | Mori | 358/213.31 |
| 5,317,174 | 5/1994 | Hynecek | 257/222 |
| 5,335,015 | 8/1994 | Cooper et al. | 348/302 |
| 5,341,008 | 8/1994 | Hynecek | 257/231 |
| 5,424,223 | 6/1995 | Hynecek | 437/3 |
| 5,428,390 | 6/1995 | Cooper et al. | 348/240 |
| 5,434,620 | 7/1995 | Higuchi et al. | 348/308 |
| 5,463,232 | 10/1995 | Yamashira et al. | 257/223 |
| 5,471,245 | 11/1995 | Cooper et al. | 348/302 |
| 5,541,402 | 7/1996 | Ackland et al. | 250/208.1 |
| 5,547,881 | 8/1996 | Wang et al. | 437/24 |
| 5,576,763 | 11/1996 | Ackland et al. | 348/308 |
| 5,589,423 | 12/1996 | White et al. | 437/228 |
| 5,614,744 | 3/1997 | Merill | 257/291 |
| 5,622,885 | 4/1997 | Merrill et al. | 438/220 |
| 5,625,210 | 4/1997 | Lee et al. | 257/292 |
| 5,631,704 | 5/1997 | Dickinson et al. | 348/308 |
| 5,705,441 | 1/1998 | Wang et al. | 438/384 |
| 5,712,682 | 1/1998 | Hannah | 348/255 |
| 5,739,562 | 4/1998 | Ackland et al. | 257/291 |
| 5,986,297 | 11/1999 | Guidash et al. | 257/223 |
| 6,040,592 | 3/2000 | McDaniel et al. | 257/292 |

FOREIGN PATENT DOCUMENTS

| | | | |
|---|---|---|---|
| 0777379A1 | 6/1997 | European Pat. Off. | H04N 3/15 |
| WO 98/57369 | 12/1998 | European Pat. Off. | |

OTHER PUBLICATIONS

David X.D. Yang et al. "Test Structures for Characterization and Comparative Analysis of CMOS Image Sensors" SPIE vol. 2950.

(List continued on next page.)

*Primary Examiner*—Ngân V. Ngô
*Attorney, Agent, or Firm*—Sierra Patent Group, Ltd.

[57] ABSTRACT

An active CMOS pixel or pixel array and method for manufacturing uses silicides to improve sheet conductivity of polysilicon and diffusions and for improved conductivity of silicon to metal connections without downgrading the photon sensing performance of the pixels. Masks are used in manufacturing of the pixels by selectively masking photon sensors from the optical opaqueness of silicides and photon sensor related circuit elements from silicide induced photon sensor dark current leakage while allowing formation of silicides for providing highly conductive contacts between. Silicides are used for improving the sheet conductivity of polysilicon and diffusions in the readout transistors and for improved conductivity of silicon to metal line connection pads.

23 Claims, 7 Drawing Sheets

OTHER PUBLICATIONS

Chye Huat Aw, et al. "A 128x128–Pixel Standard–CMOS Image Sensor with Electronic Shutter" IEEE International Solid–State Circuits Conference vol. 39, pp. 180–181,440 Feb. 1996.

R.M. Guidash, et al. "A 0.6 um CMOS Pinned Photodiode Color Imager Technology" IEDM pp. 927–929 1997.

S. Decker et, al. "A 256x256 CMOS Imaging Array with Wide Dynamic Range Pixels and Column–Parallel Digital Output " IEEE International Solid–State Circuits Conference pp. 176–177 1998.

Abbas El Garmal, et al. "Modeling and Estimation of FPN Components in CMOS Image Sensors" Information Systems Laboratory, Stanford University pp. 1–10 1987.

Alex Dickinson, et al. "TP 13.5 A 256x256 CMOS Active Pixel Image Sensor with Motion Detection" IEEE International Solid–State Circuits Conference pp. 226–227 1995.

Andrew J. Blanksby, et al. "Noise Performance of a color CMOS Photogate Image Sensor" IEEE pp. 205–208 1997.

Author Unknown, "Title Unknown" IEDM PP. 202–204 1997.

Bernwald Rossler "Electrically Erasable and Reprogrammable Read–Only Memory Using the n–Channel SIMOS One–Transistor Cell" IEEE Transactions on Electron Devices vol. ED–24, No. 5 pp. 606–610 May 1977.

Carver A. Mead, et al. "Scanners for Visualizing Activity of Analog VLSI Circuitry" California Institute of Technology Computation and Neural Systems Program pp. 1–29 Jul. 5, 1991.

Eric R. Fossum "Active Pixel Sensors: Are CCD's Dinosaurs?" SPIE vol. 1900 pp. 2–14.

Hon–Sum Philip Wong, et al. CMOS Active Pixel Image Sensors Fabricated Using a 1.8–V, 0.25–um CMOS Technology pp. 889–894 IEEE Transactions on Electron Devices vol. 45 No. 4 Apr. 1998.

Hon–Sum Philip Wong "CMOS Image Sensors—Recent Advances and Device Scaling Considerations" IEEE pp. 201–204 1997.

Orly Yadid–Pecht, et al. "A Random Access Photodiode Array for Intelligent Image Capture" IEEE Transactions on Electron Devices, vol. 38 No. 8 pp 1772–1780 Aug. 1991.

R. Daniel McGrath, et al. "FA 11.2: Current–Mediated, Current–Reset 768x512 Active Pixel Sensor Array" IEEE/ Slide Supplement pp. 182–183 & 138–139.

R. Panicacci, et al. "¼–Inch CMOS Active Pixel Sensor with Smart On–Chip Functions and full Digital Interface" Hot Chips IX pp. 41–53 Aug. 25–26 1997.

S.M. SZE "Physics of Semiconductor Devices" Wiley–Interscience pp. 526–533 1969.

Stephen John Decker "A Wide Dynamic Range CMOS Imager With Parallel On–Chip Analog–to–Digital Conversion" pp 1–205 1997.

Sunetra K. Mendis et, al "A 128 x 128 CMOS Active Pixel Image Sensor for Highly Integrated Imaging Systems" IEEE pp. 583–586 1993.

T. Delbruck et, al "Analog VLSI Phototransduction by continuous–time, adaptive, logarithmic photoreceptor circuits" California Institute of Technology Computation and Neural Systems Program CNS Memo No. 30 Apr. 2, 1996.

Tobi Delbruck, et al. "Analog VLSI Adaptive, Logarithmic, Wide–Dynamic–Range Photoreceptor" ISCAS '94 Proceedings of the Int'l Symposium on Circuits and Systems IEEE London, May 1994.

Tetuo Nomoto, et al. "FA 11.4: A 4M–Pixel Image Sensor with Block and step Access Capability" IEEE International pp. 186–187 Plus Four Additional Slides 1997.

Yoshiaki Hagiwara, Member, IEEE "High–Density and High–Quality Frame Transfer CCD Iamger with Very Low Smear, Low Dark Current, and Very High Blue Sensitivity" IEEE Transactions on Electron Devices, vol. 43 No. 12 pp . 2122–2130 Dec. 1996.

CMOS IMAGE SENSOR EMPLOYING SILICIDE EXCLUSION MASK TO REDUCE LEAKAGE AND IMPROVE PERFORMANCE

BACKGROUND OF THE INVENTION

1. Field of the Invention

The invention pertains to the field of image sensor arrays and more particularly to CMOS image sensor array active pixel apparatus and manufacturing methods that use silicide exclusion masks for improved performance by reducing dark current leakage in critical pixel element sensor and storage areas, and for improving conductivity in unmasked areas by using silicides.

2. The Prior Art

The use of silicides in CMOS multilayer-contact technology for the reduction of the sheet resistance of thin polysilicon and shallow diffusions is well known in the art (Jaeger, R. C., "Introduction to Microelectronic Fabrication", Vol. V, Section 7.5, of Neudick, G. R. et al., editors, "Modular Series on Solid State Devices", Addison-Wesley, Reading, Mass., 1993). Interconnect delays caused by high sheet resistance and distributed capacitance of polysilicon and diffusions can limit the speed of very large scale integrated (VLSI) circuits. The effective sheet resistance is reduced by forming a low-resistivity shunting layer of silicide on their surfaces by depositing an appropriate metal using evaporation, sputtering, or chemical vapor deposition (CVD) techniques and then applying heat so that the metal reacts with the silicon (and polysilicon) and produces the desired silicide. (Silicides have also been used in bipolar processes since 1960.)

Although silicides have been used to optimize the electrical performance of standard CMOS processes, the use of silicides in CMOS active pixel sensor and storage arrays has been generally avoided because the silicide is nearly optically opaque and inhibits photon penetration into the silicon pixel sensor. Most imager publications do not mention silicides because they are not used and some explicitly mention that silicides are not used in the process. For example see Blanksby, A. J., et al., "Noise Performance of a Color CMOS Photogate Image Sensor", Proc. IEEE-IEDM 1997, p. 8.6.1, Sec. A. Monochrome Image Sensor, in which it is stated that "A 352×288 photogate sensor was fabricated in a Lucent Technologies non-silicided 0.8-m CMOS process . . . "

Silicides are normally applied in unmasked process steps for reducing the contact resistance and the effective sheet resistance of the source, drain, and gate. For example, the cross sectional view of FIGS. 1(a)–1(d) show the formation of silicides in an n-type MOS structure. In FIG. 1(a), transistor 100, built on a p-type substrate, has a source area 101, drain area 102, silicon dioxide ($SiO_2$) layer 103, and polysilicon gate 110. In addition, a deposited $SiO_2$ film 120 is included for forming an oxide spacer around gate 110. FIG. 1(b) shows the MOS structure after selective etching of $SiO_2$ layer 120 for forming an oxide spacer 130 around polysilicon gate 110. In the next step, shown in FIG. 1(c), a suitable unmasked metallic film 150' is deposited over MOS structure 100 by evaporation, sputtering, or CVD techniques in preparation for forming a silicide film (typically $CoSi_2$, $HfSi_2$, $MoSi_2$, $TaSi_2$, $TiSi_2$, $WSi_2$, or $ZrSi_2$). FIG. 1(d) shows silicide film 150 which is formed by heating (sintering). Wherever metallic film 150' is in contact with silicon substrate 101 or polysilicon 110, silicide is formed and the unreacted metallic film is removed by etching. Thus, the unmasked formation of silicides, which is commonly employed in CMOS processing, creates, without discrimination, silicides on all silicon (and polysilicon) circuit components wherever they come in contact with the silicide forming metallic layer.

In the case of circuits that include image sensor and storage circuits, silicides are not considered suitable for use in the manufacturing process because unmasked silicide formation would form photon shields over the photosensitive pixel cells (photodiodes). Also, silicides are commonly used beneficially under circuit contacts for reducing contact resistance and for providing a good stop for the contact etch step. However, silicide deposits also cause increased electrical leakage at any junction to which they are applied. Consequently, pixel cells are adversely effected by the increased leakage at the junctions associated with photon detection by increasing leakage (dark) current in the pixel cell.

Because the use of silicides in image pixel arrays can have beneficial effects (increased conductivity of polysilicon and diffusions) as well as detrimental effects (increased photodiode dark current and opaqueness), it is highly desirable that the beneficial effects of silicides be realized without the detrimental effects.

The present invention provides a novel strategy for selectively masking silicides in the manufacture of active pixels and active pixel arrays so that the benefits of silicides can be selectively realized while avoiding the detrimental effects.

It should be noted that this novel concept of selectively masking the formation of silicides does not conform to commonly accepted design and manufacturing rule that prohibits contact cuts for connection pads in silicide exclusion areas. Circuit and layout designers typically limit their designs to stay within the rules. Adherence to the rule ensures that the contact cut etch process, which depends on the detection of a chemical etch product that indicates when the contact cuts reach the silicide layer, has completed the contact cut. Based on the insight provided by the present invention, this design rule is violated without sacrificing reliability of the fabrication process while gaining the benefits mentioned above.

BRIEF DESCRIPTION OF THE INVENTION

A method for selectively masking silicides in a CMOS pixel and/or CMOS pixel array, for optimizing optical characteristics by efficiently coupling photons into the silicon and optimizing electrical characteristics by allowing for compact structures with highly conductive lateral contacts for capacitor structures, and for providing highly conductive contacts between readout transistors and metal readout lines, is based on identifying the circuit elements associated with photon sensing that require efficient photon coupling into the photon sensor and associated circuitry elements that require low leakage characteristics for minimizing leakage (dark) current; and selectively masking the circuit elements identified in the previous step for preventing the formation of silicides while forming silicides in the unmasked areas.

Another embodiment is for a CMOS active pixel image sensor apparatus having selectively formed silicide deposits for improved optical and electrical performance. The apparatus having a pixel with a photon sensor and associated electrical elements that include photon sensor associated electrical elements requiring low leakage electrical characteristics for maintaining low photon sensor dark current, and photon sensor readout elements. The photon sensor readout elements use silicides for improving polysilicon and diffusion sheet conductivity, for improving silicon to metal connector conductivity, and for improving capacitor plate and contact conductivity.

BRIEF DESCRIPTION OF THE DRAWINGS

The present invention may be more fully understood from the detailed description given below and from the accompanying drawings of the preferred embodiments of the invention, which, however, should not be taken to limit the invention to the specific embodiment but are for explanation and understanding only.

DESCRIPTION OF THE PREFERRED EMBODIMENTS

Although there are beneficial effects of silicides in CMOS circuits, i.e. increased sheet conductivity of silicon (and polysilicon) and improved conductivity of metal to silicon connections, silicides have not been used in CMOS active sensor arrays because of two major reasons. First, silicide opaqueness inhibits the coupling of photons into the silicon of the photon sensor (detector). In addition, silicides can cause increased electrical leakage at junctions to which they are applied.

However, because of the benefits that can be obtained through the use of silicides in those areas of a CMOS active pixel sensor or sensor array that do not require exposure to photons or can tolerate the increased electrical leakage associated with the use of silicides, it may be desirable to use silicides for overall improved performance of active pixel imaging apparatus.

As a general rule, to take advantage of the potentially beneficial effects of silicide deposition, a CMOS pixel (subsequently referred to simply as "pixel") or pixel array should be analyzed to identify: (a) areas that contain photon sensing elements that require exposure to image generated photons; (b) areas that contain silicon-to-metal connections that are associated with the photon sensing elements that if treated to improve connection or sheet conductivity through the use of silicides would result in an unacceptable level of photon sensor electrical leakage (dark current); and (c) areas with connections that would benefit from the application of silicides.

Figure 1A:
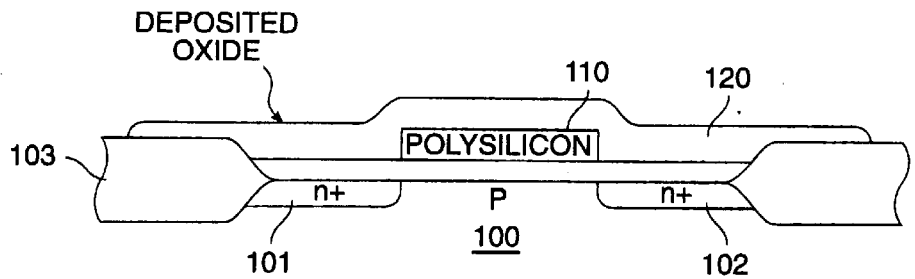
FIG. 1(a) is a cross sectional view of an n-type MOS transistor with polysilicon gate and deposited silicon oxide layer.
Figure 1B:
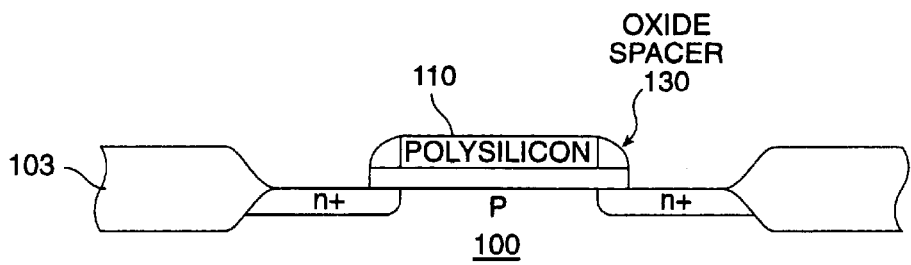
FIG. 1(b) is a cross sectional view of an n-type MOS transistor with polysilicon gate and oxide spacer after etching.
Figure 1C:
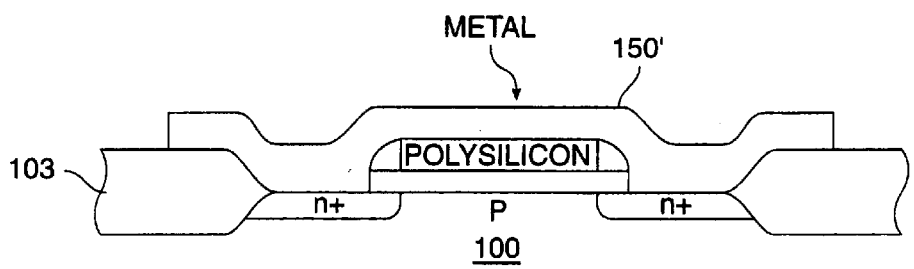
FIG. 1(c) is a cross sectional view of an n-type MOS transistor with polysilicon gate and a deposited silicide forming metal film.
Figure 1D:
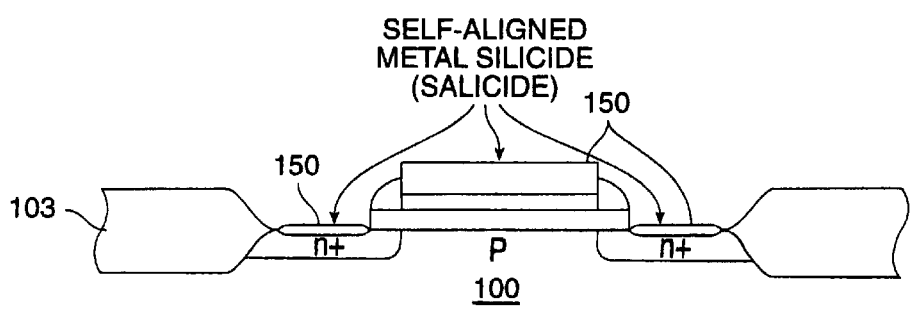
FIG. 1(d) is a cross sectional view of an n-type MOS transistor with polysilicon gate after forming silicide deposits.
Figure 2:
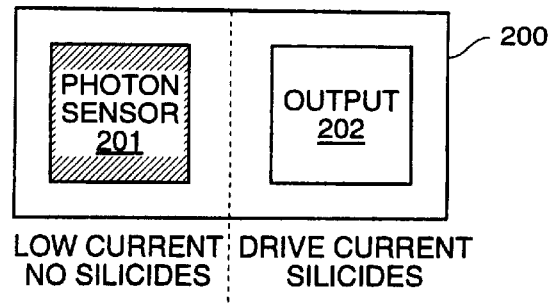
FIG. 2 shows a block diagram of a generic CMOS active pixel array showing silicide masking of the photon sensor circuits.

Having identified these areas, a silicide exclusion mask can be designed that would prevent the deposition of silicides on areas identified in areas (a) and (b) while allowing the deposition of silicides on the areas identified in (c). FIG. 2 is a block diagram that symbolically represents the silicide mask 200 showing a masked area 201 where the formation of silicides is to be prevented and an unmasked area 202 where silicides are to be formed. By use of such a mask, the beneficial uses of silicides in active pixel sensor apparatus can be realized without the detrimental effects.

Figure 3A:
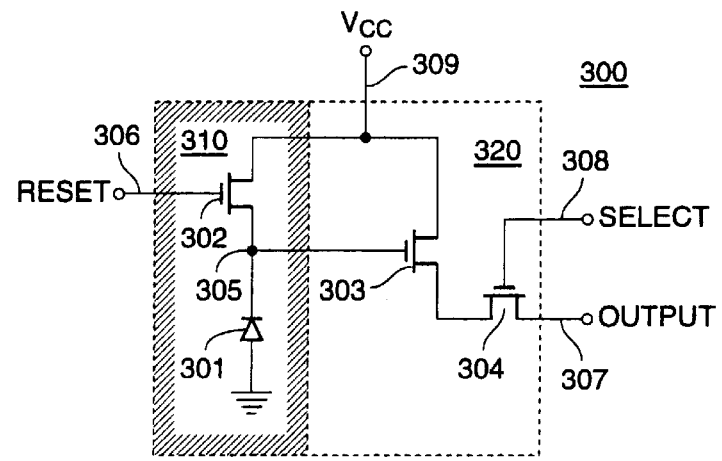
FIG. 3(a) is a circuit diagram of a three transistor pixel circuit.

As a specific example, FIG. 3(a) is a schematic diagram of three transistor active NMOS pixel sensor 300 in which the circuit elements that are to be protected by silicide exclusion masking are identified. Pixel 300 is shown divided into the photon sensor circuit 310 and the output circuit 320. Photon sensor circuit section includes photodiode 301 for detecting photons generated by the image subject and NMOS reset transistor 302 for resetting photodiode 301 by means of the gate labeled RESET. When RESET is activated, the cathode of $n^+/p$ photodiode 301 is connected to the drain supply voltage, $V_{cc}$, so that the capacitance of the reverse-biased diode is charged to $V_{cc}$. The charge accumulating node (cathode) of photodiode 301 is also connected to the gate of NMOS transistor 303 which operates in a source-follower mode with row-select switch NMOS transistor 304 connected as the source load. The source of transistor 304 is connected to column output transfer line 90 and transfers a signal representative of the charge on the charge accumulating node of photodiode 301 when the SELECT gate of row select transistor 304 is activated. Upon resetting the pixel by activating the RESET gate 306 of transistor 302, the pixel is ready for a new exposure. Silicide exclusion mask area, in which no silicide is to be formed, corresponds to section 310 that encompasses photodiode 301 and the source area on the silicon substrate of reset transistor 302 wherein a juncture with contact 313 is formed, while silicides may be formed, as required, in the pixel output section 320.

Figure 3B:
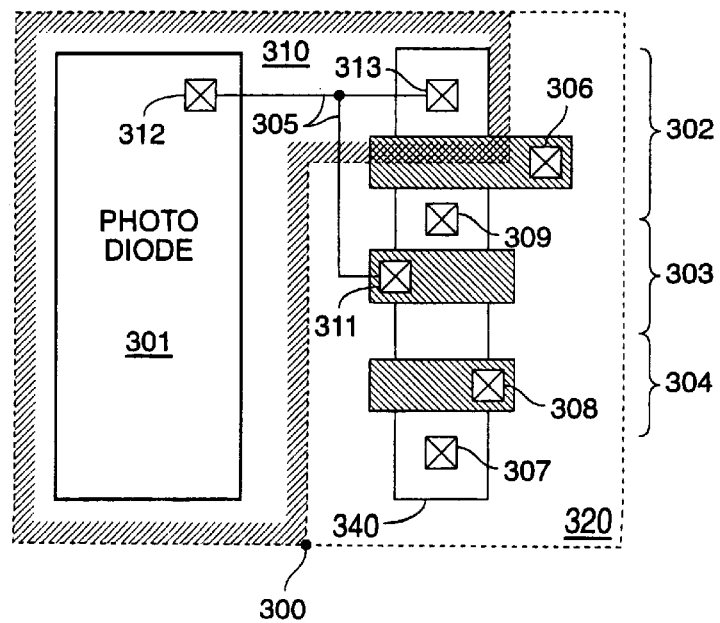
FIG. 3(b) shows a layout view of the three transistor pixel circuit of FIG. 3(a) and silicide exclusion areas.

FIG. 3(b) is a top layout view of the active pixel 300 showing the areas in which the circuit elements of FIG. 3(a) are formed on the p-type substrate of pixel 300. As in FIG. 3(a), the two areas are labeled 310 and 320 designating the respective area where no silicide is to be formed and the area in which silicide may be formed. Transistors 302–304 are built on n+ active area 340 with their respective polysilicon gates shown as cross-hatched areas traversing n+ active area 340 at right angles. Within area 310, the photodiode 301, which has a n+ region for the cathode and the p-substrate as its anode, is shown. Upper layer metal line 305 connects the charge accumulating node (cathode) of photodiode 301 at connection pad 312, the n+ source of transistor 302 at pad 313, and the gate of transistor 303 at pad 311. Accordingly, photodiode 301 and the source area on the silicon substrate of reset transistor 302 wherein a juncture with contact 313 is formed are to be masked from any silicide formation. Because the gate of transistor 302 is insulated by a $SiO_2$ layer, silicide can be applied to connector pad 306 for improved conductance with a metallic reset control line. Thus, area 320 includes, in addition to connector pad 306, the transistor 303, select transistor 304, $V_{cc}$ connection pad 309 in the n+ region forming the drains of transistors 302 and 303, output connection pad 307 for connecting to column output line 90, connection pad 311 for connecting to the gate of transistor 303, and a portion of the polysilicon gate of transistors 302, including its connection pad.

Figure 4A:
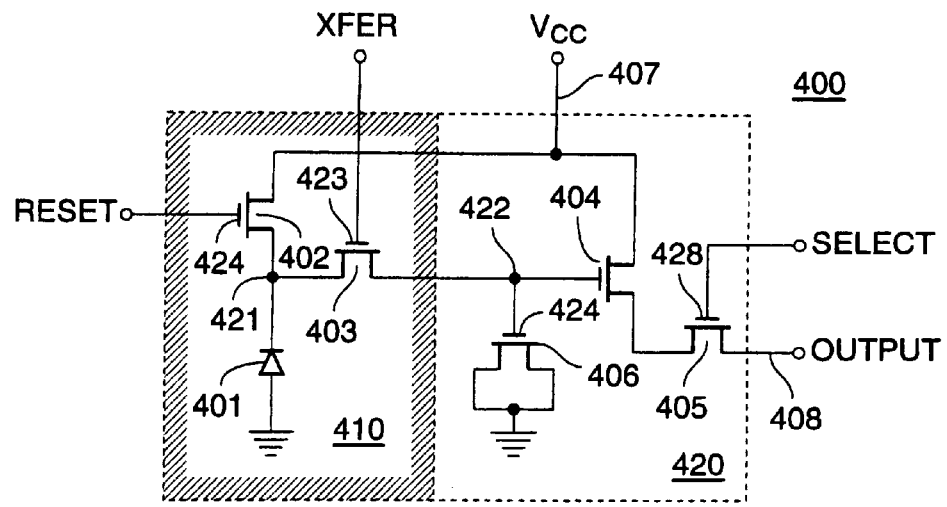
FIG. 4(a) is a circuit diagram of a four transistor pixel circuit with capacitor memory.

FIG. 4(a) is an example of a NMOS pixel storage sensor 400 that uses a photodiode 401, four transistors 402–405, and a capacitor 406 as a photodiode current accumulating memory. (Capacitor 406 is typically implemented as an NMOS storage capacitor transistor.) Pixel sensor 400 is initialized by activating the RESET gate 424 of transistor 402 and the XFR gate 423 of transistor 403 so that supply voltage $V_{cc}$ (407) is connected to the cathode of photodiode 401 and to capacitor 406 for charging to an initial value of $V_{cc}$. After initial charging is completed, reset transistor 402 is turned off by lowering the RESET gate voltage and photodiode 401 is ready to receive image subject generated photons. After sufficient number of photons have been received and the associated photodiode current is integrated in capacitor 406, transfer transistor 403 is turned off by lowering the XFR gate voltage thus isolating capacitor 406 from photodiode 401. When required, the value of charge on capacitor 406 is readout through the source-follower circuit comprising transistors 404 and 405 by activating the SELECT gate 428 of transistor 405. When the pixel is reset after readout, it is ready to receive another image. Silicide exclusion mask 410 encompasses photodiode 401, the drain area on the silicon substrate of transistor 403 wherein a juncture with contact 433 is formed, and the source area on the silicon substrate of transistors 402 and 403 wherein a juncture with contact 434 is formed to prevent silicide formation because of the opaqueness and increased electrical (dark current) leakage that would result. The circuit elements in the unmasked area 420 can be deposited with silicide for the beneficial results that would obtain.

Figure 4B:
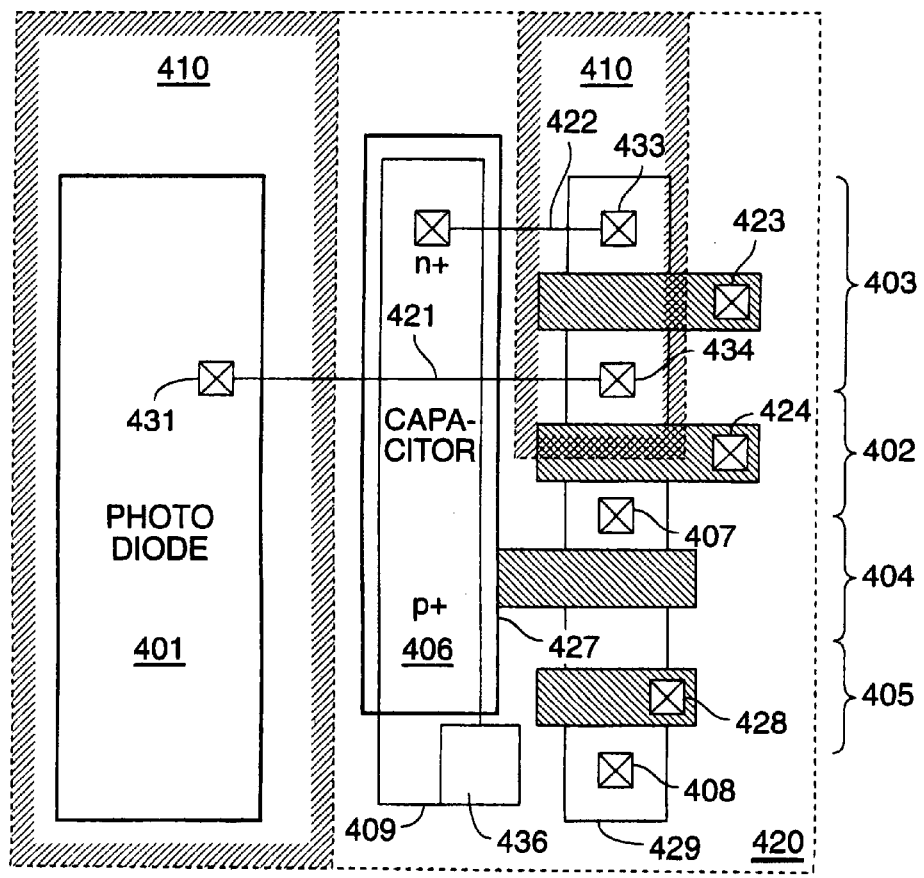
FIG. 4(b) shows a layout view of the four transistor pixel circuit of FIG. 4(a) and silicide exclusion areas.

FIG. 4(b) is a layout view of storage pixel 400 as formed on a p-type silicon substrate. Circuit components of FIG. 4(b) are labeled with the same reference numerals that are used for corresponding elements in FIG. 4(a). NMOS storage pixel sensor 400 is fabricated on a p-type substrate. Photodiode 401 has a n+ layer for the cathode and the p-type substrate as its anode. Capacitor 406 has a polysilicon layer upper-plate 427 separated from n+ implant lower plate 409 by a $SiO_2$ dielectric layer. A p+ implant region, 436, makes contact with the p-type substrate. The lower plate of capacitor 406 is connected to the substrate by connecting regions 436 and 409. Because silicide is not excluded from area 420, regions 436 and 409 are connected by a region of overlapping silicide. N-channel MOS transistors 402-405 are formed in n+ active region 429.

Metal line 422 connects the n+ polysilicon region of the upper-plate 427 of capacitor 406 to the n+ drain region contact 433 of NMOS transistor 403. The n+ cathode region of photodiode 401 is connected by metal line 421 to the n+ contact 434 that forms the sources of NMOS transistors 402 and 403. $V_{cc}$ connection 407 is in the n+ region that forms the drains of NMOS transistors 402 and 404. The n+ region between the gates of transistors 404 and 405 forms the source of transistor 404 and the drain of transistor 405. Output connection pad 408 is formed in the n+ source region of transistor 405. Connection pad 407 is used to make a metal connection to $V_{cc}$ and connection pads 408 and 428 respectively are used to make a metal connection from transistor 405 source to output column line 90 and from transistor 405 gate to the row select line 91. The p-type substrate may have p-well regions defined in it as described in the referenced related patent application.

Circuit elements that are to be protected from silicide formation are in masked areas 410 and include photodiode 401, the drain area on the silicon substrate of transistor 403 wherein a juncture with contact 433 is formed, and the source area on the silicon substrate of transistors 402 and 403 wherein a juncture with contact 434 is formed. Candidate circuit elements for silicide formation include the polysilicon upper-plate 427 of capacitor 406, the transistor 405, portions of the polysilicon gates of transistors 402 and 403 including the connection pads 423 and 424, and connection pads 407–408. An upper layer metallic line 421 connects the cathode of photodiode 401 and the source of transistor 402.

Figure 5:
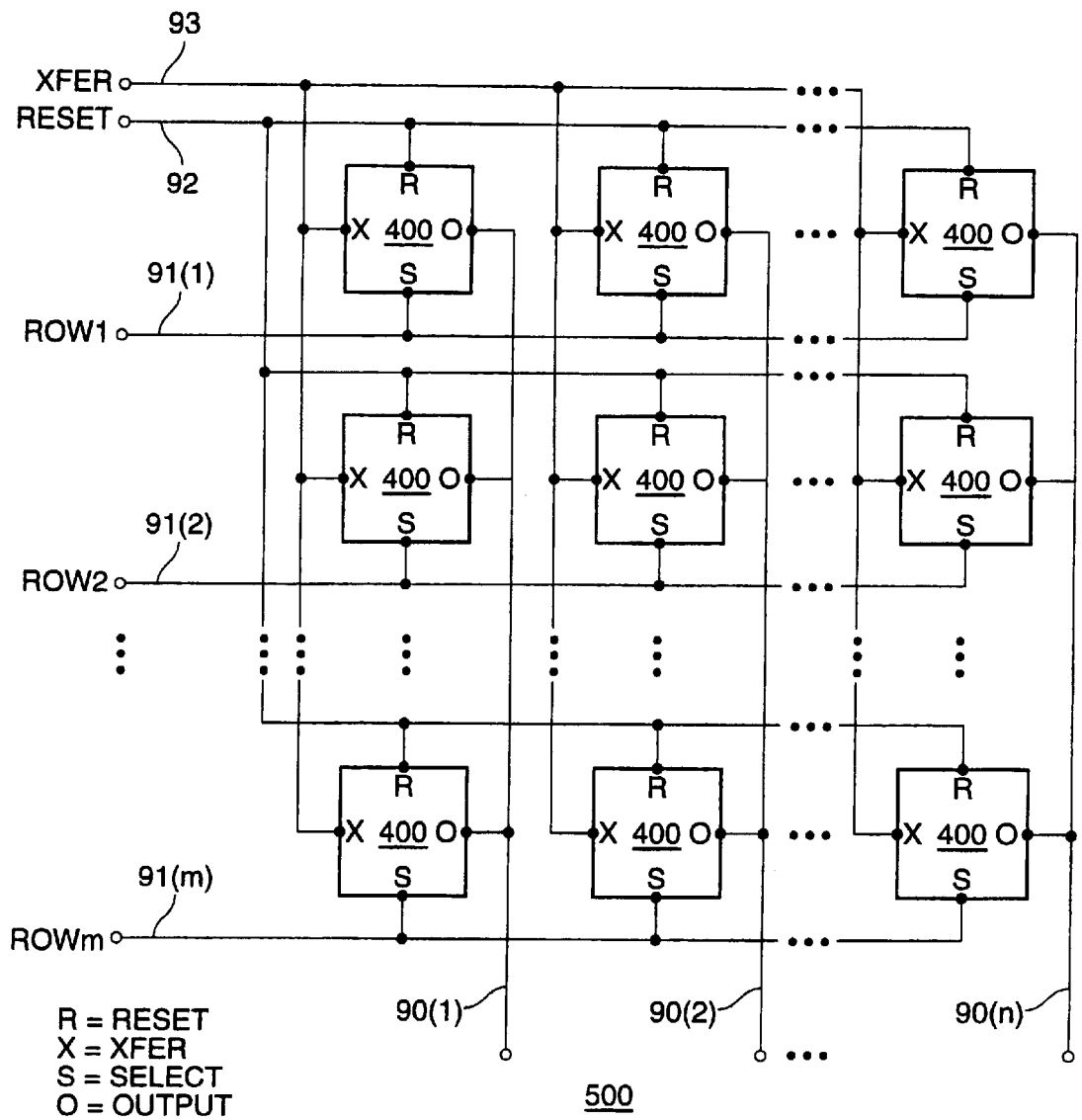
FIG. 5 is a block diagram of a CMOS active pixel image sensor array.

A CMOS active pixel image sensor array 500, such as might be used in an electronic camera to form the camera subject image at the focal plane, is shown in FIG. 5. In this example, the structure is an m×n array of CMOS active pixels 400 (such as shown in FIGS. 4(a) and 4(b)). One or more columns can be used for parallel output of photon sensor data on column output lines 90(1)–90(n). Each pixel 400 in a given column has its output terminal 408 connected to a common column line 90(1)–90(n). A particular row is selected by activating the corresponding row line from row lines 91(1)–91(m) which causes transistor 405 to switch on. A common transfer (XFER) line 93 is used for controlling the gate of transistor switch 403 in each pixel 400 for parallel connecting capacitor 406 to, and disconnecting capacitor 406 from, photodiode 401. With each capacitor 406 connected in parallel with its associated photodiode 401, activating the RESET line causes the photodiode and capacitor to be charged to the prescribed initial voltage. Upon deactivating RESET line, the image can be formed on the pixel array for a prescribed interval during which each pixel 400 integrates the photodiode current in capacitor 406. When the prescribed interval expires, XFER line 93 deactivates the gate of transistor switch 403 which disconnects capacitor 406 from photodiode 401. The image is now stored on capacitor 406 of each pixel 400 and is ready for readout row-by-row, on column lines 90(1)–90(n), by sequentially activating row control lines 91(1)–91(m).

Figure 6A:
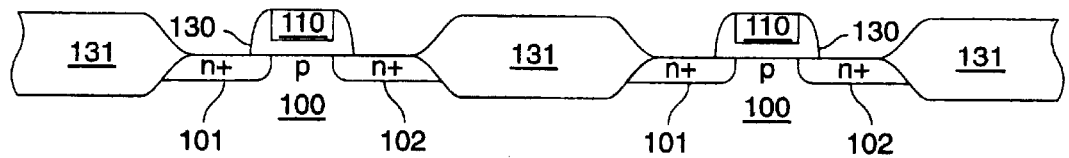
FIG. 6(a) is a cross sectional view of an n-type MOS transistor array.
Figure 6B:
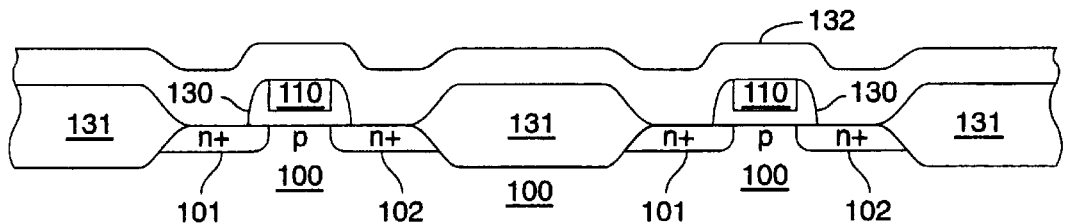
FIG. 6(b) is a cross sectional view of the n-type MOS transistor array of FIG. 6(a) with a globally deposited silicon dioxide layer.
Figure 6C:
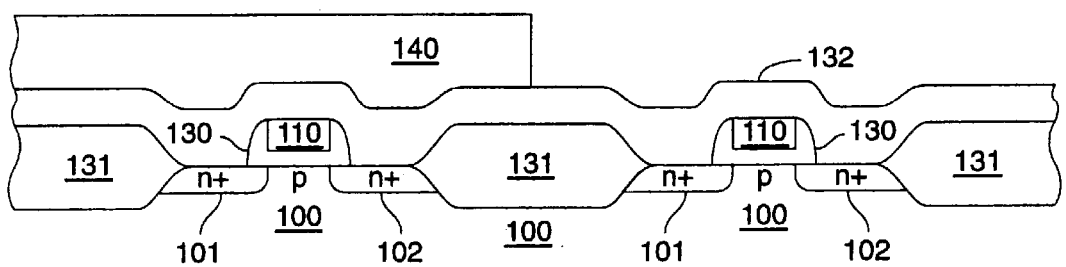
FIG. 6(c) is a cross sectional view of the n-type MOS transistor array of FIG. 6(b) with a silicide exclusion mask patterned in the photoresist.
Figure 6D:
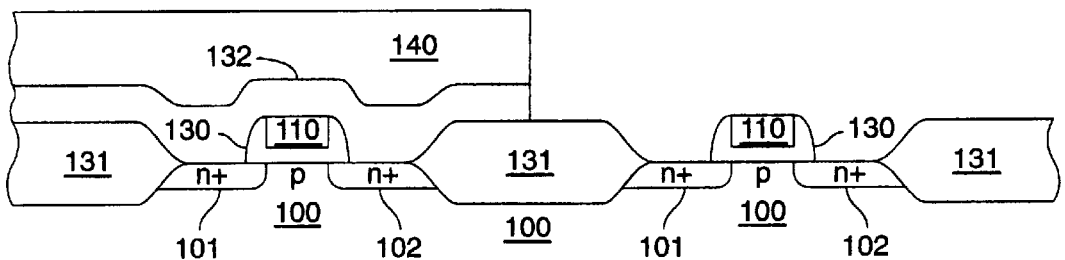
FIG. 6(d) is a cross sectional view of the n-type MOS transistor array of FIG. 6(c) after etching of the exposed silicon dioxide layer.
Figure 6E:
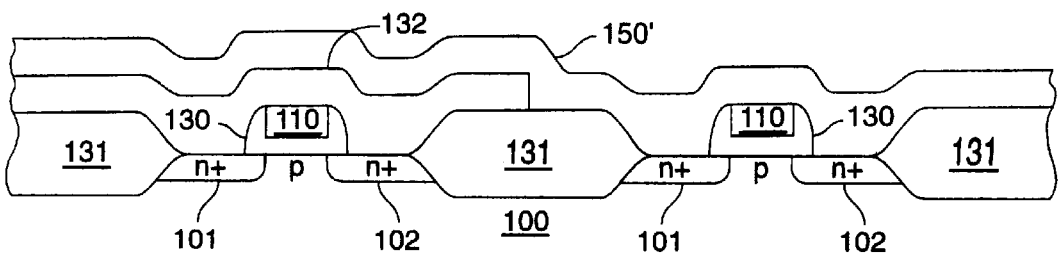
FIG. 6(e) is a cross sectional view of the n-type MOS transistor array of FIG. 6(d) after globally depositing a layer of siliciding metal.
Figure 6F:
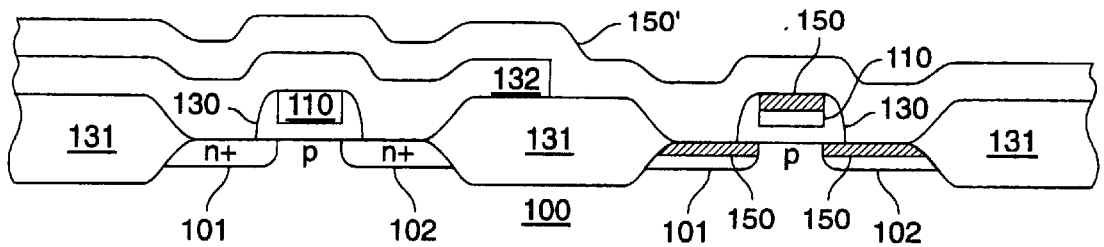
FIG. 6(f) is a cross sectional view of the n-type MOS transistor array of FIG. 6(e) after forming silicide by applying, heat.
Figure 6G:
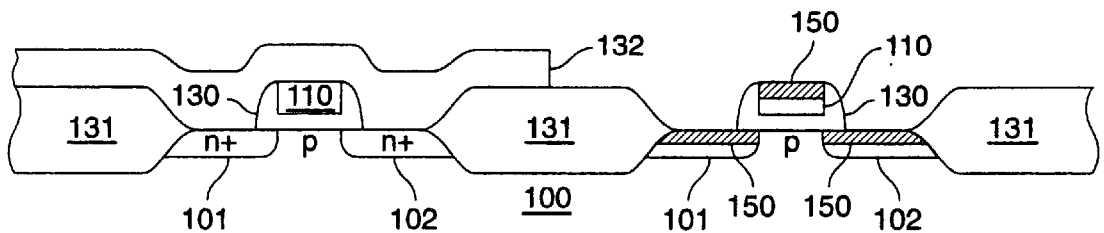
FIG. 6(g) is a cross sectional view of the n-type MOS transistor array of FIG. 6(f) after removal of the unreacted siliciding metal.
Figure 6H:
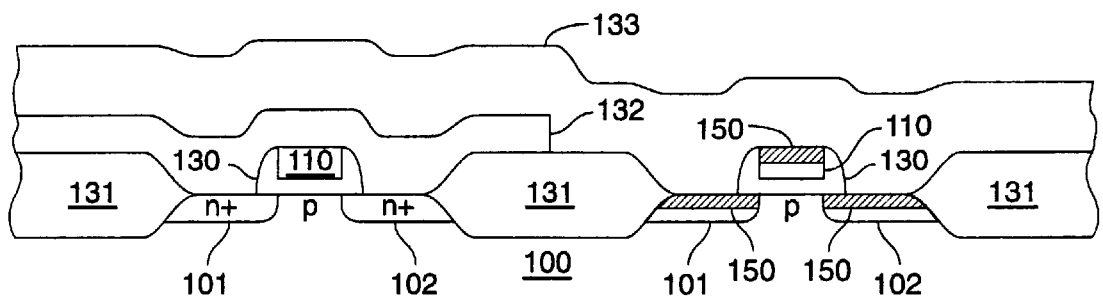
FIG. 6(h) is a cross sectional view of the n-type MOS transistor array of FIG. 6(g) after globally depositing a first silicon dioxide layer.
Figure 6I:
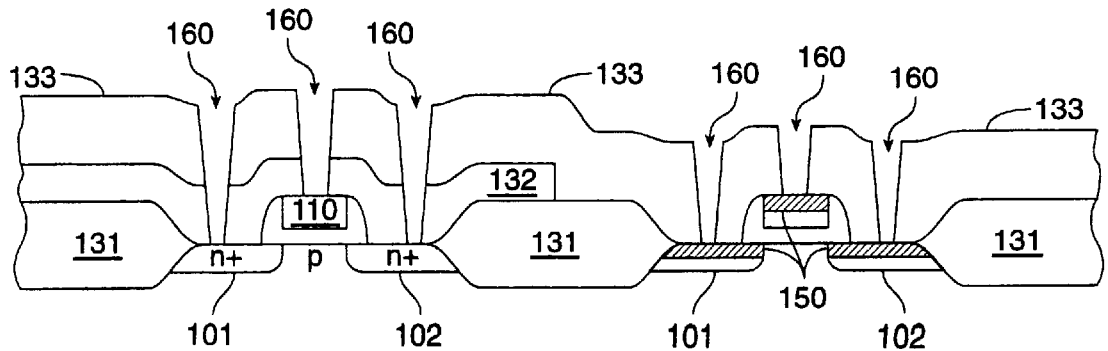
FIG. 6(i) is a cross sectional view of the n-type MOS transistor array of FIG. 6(h) after contact cuts are etched through the first silicon dioxide layer in preparation for applying the normal MOS first metal layer.

The formation of silicides on selected portions of the output circuit areas 320 and 420 of FIGS. 3(a)–(b) and 4(a)–(b), respectively, is preferably by the method shown in FIGS. 6(a)–(i) or by some equivalent method. Referring to FIG. 6(a), each n-type transistor 100 is formed on a p-type substrate with diffused n+ source area 101, diffused n+ drain area 102, and polysilicon gate 110 isolated by oxide spacer 130 (as previously described with respect to FIG. 1). Transistors are isolated by silicon dioxide ($SiO_2$) barrier 131. The areas to be protected from the formation of silicides are selectively masked by first depositing a $SiO_2$ global layer 132 of approximately 100 nm as shown in FIG. 6(b). FIG. 6(c) shows the use of a silicide exclusion mask for patterning of a photoresist layer deposited over the elements that are to be masked from silicide formation. FIG. 6(d) shows the result of selectively etching away $SiO_2$ deposit 132 in the areas not masked by photoresist mask 140 for exposing the silicon and polysilicon elements in the regions to be silicided (e.g. the non-masked output circuit regions of 320 and 420 of FIGS. 3(a)–(b) and 4(a)–(b). A suitable silicide forming metal 150' (typically titanium (Ti) or cobalt (Co)) is deposited over the entire surface as shown in FIG. 6(e) and then the surface is heated to form silicide 150 wherever the silicide forming metal is in contact with the silicon and polysilicon surfaces as shown in FIG. 6(f). The unreacted metal film 150' is etched away to leave the desired silicide deposits 150 as shown in FIG. 6(g). The methods for depositing $SiO_2$ and silicide forming metals and for etching to remove the same are well known in the art (op. cit. Jaeger, R. C.). Normally, the next fabrication step (FIG. 6(h)) is the usual CMOS deposition of $SiO_2$ for first dielectric layer 133. (The added thickness of $SiO_2$ layer 132 is insignificant, although shown exaggerated for clarity). FIG. 6(i) shows contact cuts 160 that are made in dielectric layers 132 and 133 for making metal-to-silicon and metal-to-silicide connections. (Stopping the cuts shortly after detecting the presence of silicide controls the depth of contact cuts.)

Figure 7:
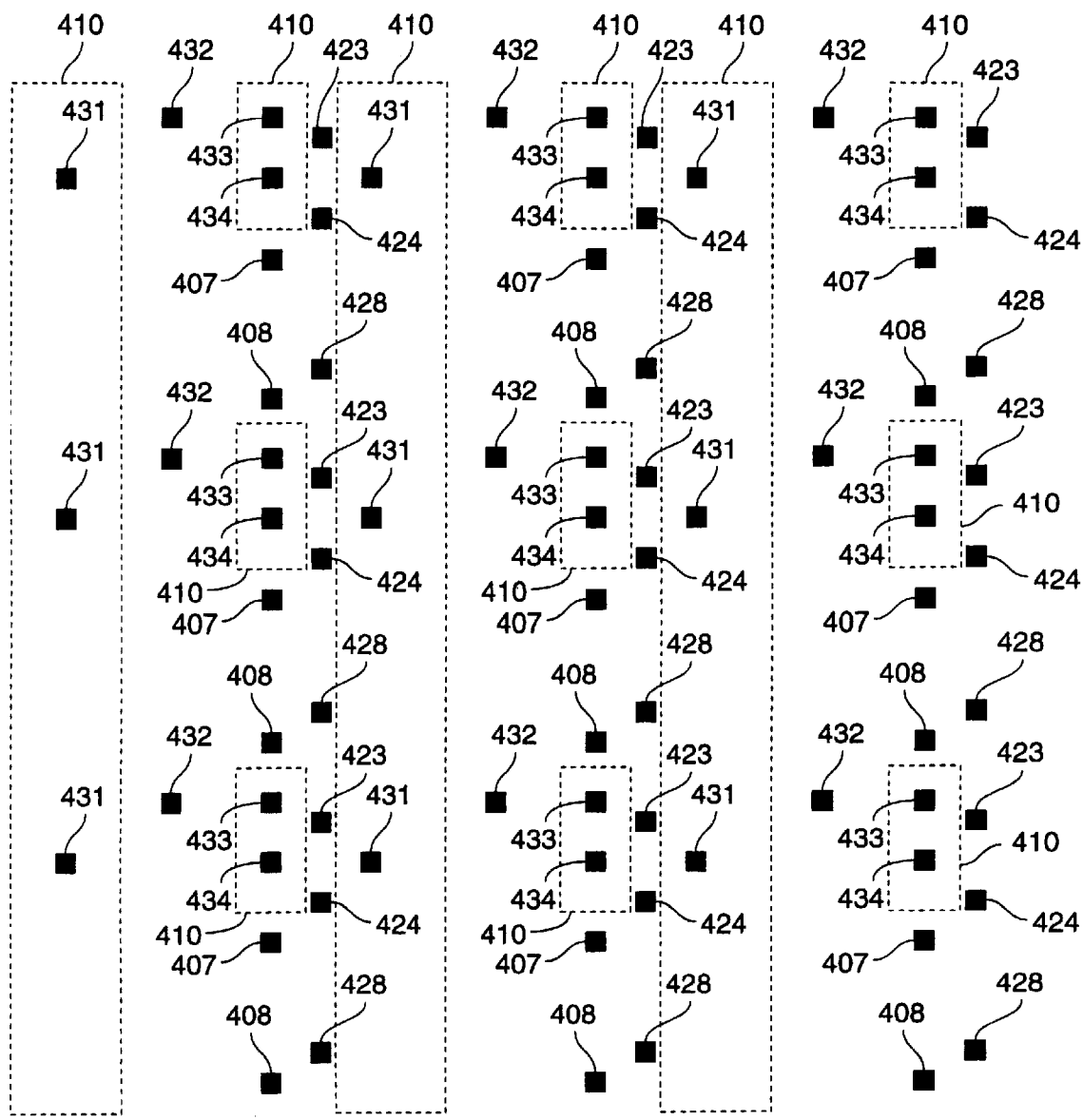
FIG. 7 shows an example of a silicide exclusion mask for a 3×3 array of four transistor pixels.

FIG. 7 is an example of a silicide exclusion mask for a 3×3 active pixel array with pixels of the type shown in FIGS. 4(a) and 4(b). Exclusion areas that are to be protected from the formation of silicides are labeled 410. For ease in relating masked areas 410 with the elements of the pixel shown in FIG. 4(b), connection pads for connecting silicon or polysilicon to metal lines are shown as small shaded squares that are identified by indices that correspond to those used in FIG. 4(b) as follows: 431 is the non-silicided connection pad on photodiode 401; 432 is the connection on upper plate 424 of capacitor 406; 433–434 are the non-silicided connections at the drain of transistor 403 and the source of transistors 402–403, respectively; 423–424 are the silicided gate connectors of transistors 403 and 402, respectively; 407, 408, and 428 are silicided connection pads respectively at the drains ($V_{cc}$) of transistors 402 and 404, and the source (OUTPUT) and gate of transistor 405.

Silicide exclusion areas 410, under which the non-silicided connection pads 431, 433 and 434 are located, would prevent the formation of silicide under the masked silicide exclusion areas by preventing the silicide forming metal layer from contacting the silicon and polysilicon areas under the mask. In case of connection pad 431, the silicide masking ensures photon sensitivity of the photodiode by preventing the formation of a silicide photon shield over the photodiode and also reduces dark current leakage associated with silicided diode junction areas. In the case of connection pads 433 and 434, silicide exclusion masking protects against increased electrical leakage of the photon detection associated transistors 402 and 403. Gate connection pads 423–424 of transistors 403 and 404 are relatively immune to silicide caused electrical leakage because of the insulating $SiO_2$ layer beneath the polysilicon gates.

It should be noted that the exclusion of silicide from connection pads 433 and 434 violates the widely accepted fabrication design rules that call for the use of silicide on all connection pads. By recognizing the benefits that accrue from violating current practice, improved photon sensitivity is realized by eliminating silicides in the photon detection circuitry silicon-to-metal connection pads. The increased resistance due to the non-silicided contact is acceptable since the low-level photon generated currents involved do not cause significant voltage drops. Also, because the mask layout shown in FIG. 7 has sufficient contact cuts in the silicided areas to give a reliable etch stop indication, fabrication of an optimally designed CMOS active pixel array is realized.

The above description was limited to NMOS type structures for clarity of explanation of the invention. However, the use of PMOS type structures for obtaining functionally equivalent circuits is well known so that the principles described above may be readily applied. The description was limited to active pixels, but it will be understood that similar advantages may be obtained by applying the invention to passive pixel circuits that comprise charge accumulation nodes and readout circuits. As will be understood by those skilled in the art, many other changes in the methods and apparatus described above may be made by the skilled practitioner without departing from the spirit and scope of the invention, which should be limited only as set forth in the claims that follow.

What is claimed is:

1. A CMOS active pixel image sensor apparatus having selectively formed silicide deposits for improved optical and electrical performance, the apparatus comprising a pixel with a photon sensor and associated circuit elements, the associated circuit elements requiring low leakage electrical characteristics for maintaining low photon sensor dark current, the apparatus further comprising a photon sensor output circuit for accessing the photon sensor, wherein the photon sensor output circuit elements employ silicides on silicon surfaces thereof for improved electrical conductivity.

2. The pixel image sensor apparatus of claim 1 further including a capacitor for storing photon sensor generated electrical charge having a silicided polysilicon upper plate.

3. The apparatus of claim 1 wherein the photon sensor is a photodiode.

4. A CMOS active pixel image sensor array comprising an array of CMOS active pixels, each CMOS active pixel comprising selectively formed silicide deposits for improved optical and electrical performance, each pixel having a photon sensor and associated circuit elements, the associated circuit elements requiring low leakage electrical characteristics for maintaining low photon sensor dark current, each CMOS active pixel further comprising a photon sensor readout circuit for reading out photon sensor data, wherein selected photon sensor readout circuit elements employ silicides on silicon surfaces thereof for improved electrical conductivity.

5. A CMOS active pixel image sensor apparatus optimized for optical and electrical performance through the selective formation of silicides for improved electrical sheet and connection conductivity while maintaining optimal photon coupling to, and low dark current leakage from, the active pixel image sensor apparatus photon sensor, the apparatus comprising:

(a) a photon sensor circuit that includes a photodiode for a photon sensor, and a reset circuit for initializing the photon sensor circuit by charging the photodiode cathode-to-anode capacitance to a known voltage level; and (b) a readout circuit coupled to the photodiode cathode for reading out the photodiode charge level after the photodiode has been exposed to photons generated by an image subject, the readout circuit further comprising a silicide layer formed on silicon surfaces thereof for increased conductivity of selected circuit elements.

6. The apparatus of claim 5 wherein the selected circuit elements include polysilicon gates.

7. The apparatus of claim 5 wherein the selected circuit elements include diffusions.

8. The apparatus of claim 5 wherein the selected circuit elements include silicon to metal connections.

9. The apparatus of claim 5 wherein the readout circuit further includes a switch for selectively connecting the readout circuit output to an array column output line.

10. A CMOS active pixel image sensor apparatus optimized for optical and electrical performance through the selective formation of silicides for improved electrical sheet and connection conductivity while maintaining optimal photon coupling to, and low dark current leakage from, the sensor apparatus photon sensor, the apparatus comprising:

(a) a photon sensor circuit that includes a photodiode for sensing image subject generated photons and producing a photodiode current that is representative of the number of photons sensed, an externally controlled first switch for selectively connecting a capacitor in parallel with the photodiode for integrating the photodiode current to produce a charge representative of the integrated current, and an externally controlled reset circuit, externally controlled by a second switch for initializing the photon sensor circuit by charging the photodiode cathode-to-anode capacitance and by charging a capacitor to a known voltage level when the capacitor is connected in parallel with the photodiode by the first switch; and (b) a readout circuit having a capacitor selectively connected in parallel with the photodiode by the externally controlled first switch for initializing the capacitor charge and for integrating the photodiode current and for producing a charge representative of the integrated photodiode current, and an externally controlled third switch for selectively connecting the capacitor charge to an output connection after the photodiode has been exposed to photons for a prescribed interval of time, the output connection connected to a column output line by the third switch that is controlled by a common row select line, the readout circuit further comprising a silicide layer formed on silicon surfaces thereof for increased conductivity of selected circuit elements.

11. The apparatus of claim 10 wherein the selected circuit elements include polysilicon gates.

12. The apparatus of claim 10 wherein the selected circuit elements include diffusions.

13. The apparatus of claim 10 wherein the selected circuit elements include silicon to metal connections.

14. The apparatus of claim 10 wherein the capacitor is a MOS transistor connected to form a capacitor between the transistor gate and the commonly connected source and drain of the transistor.

15. The apparatus of claim 10 wherein the first switch for connecting the capacitor in parallel with the photodiode when the capacitor is used to integrate photodiode current is also used for disconnecting the capacitor from the photodiode when the photodiode current is no longer to be integrated.

16. The array of claim 10 wherein the first, second, and third externally controlled switches are gate-controlled MOS transistors with silicided gates and connection pads for improved conductivity.

17. An array of CMOS active pixel image sensors organized to cover an area of a camera image-plane, each active pixel image sensor assigned to a specific location in the image-plane, the specific location specified by a row and column coordinate, and each active pixel image sensor connected by a selectable common row select line and a common selectable column output line for outputting a selected active pixel image sensor, each active pixel image sensor apparatus optimized for optical and electrical performance through the selective formation of silicides for improved electrical sheet and connection conductivity while maintaining optimal photon coupling to, and low dark current leakage from, the sensor apparatus photon sensor, each active pixel image sensor comprising:

(a) a photon sensor circuit that includes a photodiode for sensing image subject generated photons and producing a photodiode current that is representative of the number of photons sensed, an externally controlled first switch for selectively connecting a capacitor in parallel with the photodiode for integrating the photodiode current to produce a charge representative of the integrated current, and an externally controlled reset circuit, externally controlled by a second switch for initializing the photon sensor circuit by charging the photodiode cathode-to-anode capacitance and by charging a capacitor to a known voltage level when the capacitor is connected in parallel with the photodiode by the first switch; and (b) a readout circuit having a capacitor selectively connected in parallel with the photodiode by the externally controlled first switch for initializing the capacitor charge and for integrating the photodiode current and for producing a charge representative of the integrated photodiode current, and an externally controlled third switch for selectively connecting the capacitor charge to an output connection after the photodiode has been exposed to photons for a prescribed interval of time, the output connection connected to a column output line by the third switch that is controlled by a common row select line, the readout circuit further comprising a silicide layer formed on silicon surfaces thereof for increased conductivity of selected circuit elements.

18. The apparatus of claim 17 wherein the selected circuit elements include polysilicon gates.

19. The apparatus of claim 17 wherein the selected circuit elements include diffusions.

20. The apparatus of claim 17 wherein the selected circuit elements include silicon to metal connections.

21. The apparatus of claim 17 wherein the capacitor is a MOS transistor connected to form a capacitor between the transistor gate and the commonly connected source and drain of the transistor.

22. The apparatus of claim 17 wherein the first switch for connecting the capacitor in parallel with the photodiode when the capacitor is used to integrate photodiode current is also used for disconnecting the capacitor from the photodiode when the photodiode current is no longer to be accumulated.

23. The apparatus of claim 18 wherein the first, second, and third externally controlled switches are gate-controlled MOS transistors with silicided connection pads on the gates for improved conductivity.

* * * * *